(12) United States Patent
Ishizaki

(10) Patent No.: US 8,248,866 B2
(45) Date of Patent: Aug. 21, 2012

(54) SEMICONDUCTOR STORAGE DEVICE AND ITS CONTROL METHOD

(75) Inventor: Tatsuya Ishizaki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/801,426

(22) Filed: Jun. 8, 2010

(65) Prior Publication Data

US 2011/0051534 A1    Mar. 3, 2011

(30) Foreign Application Priority Data

Aug. 27, 2009    (JP) .................................. 2009-196174

(51) Int. Cl.
*G11C 7/00*    (2006.01)

(52) U.S. Cl. ....... 365/189.14; 365/189.001; 365/189.03; 365/189.04; 365/189.15; 365/189.16; 365/189.05; 365/230.01; 365/230.06; 365/233.19

(58) Field of Classification Search ........... 365/189.011, 365/189.03, 189.04, 189.14, 189.15, 189.16, 365/189.05, 230.01, 230.06, 233.19
See application file for complete search history.

(56) References Cited

U.S. PATENT DOCUMENTS

| 5,777,927 | A | * | 7/1998 | Takahashi et al. | ....... 365/189.18 |
| 2005/0105380 | A1 | * | 5/2005 | Takahashi et al. | ............ 365/233 |
| 2005/0265086 | A1 | * | 12/2005 | Takano et al. | ............ 365/189.05 |
| 2007/0211554 | A1 | * | 9/2007 | Pelly et al. | ................ 365/230.02 |
| 2008/0151670 | A1 | * | 6/2008 | Kawakubo et al. | ............ 365/222 |

FOREIGN PATENT DOCUMENTS

| JP | 60-236185 | 11/1985 |
| JP | 7-312080 | 11/1995 |

* cited by examiner

*Primary Examiner* — Fernando Hidalgo

(74) *Attorney, Agent, or Firm* — McGinn IP Law Group, LLC

(57) ABSTRACT

A semiconductor storage device, in which successive reading and successive writing of data having a predetermined length from and to a memory cell specified by a certain address are performed, includes a plurality of memory cells, address input terminals through which the address is input, data output terminals through which read data having the predetermined length is output, and data input terminals through which write data having the predetermine length is input. Part of the address input terminals are also used as the data output terminals. In this way, the operation of successive reading and successive writing performed in succession at the same address can be made faster without increasing the number of terminals.

18 Claims, 4 Drawing Sheets

|  | RELATED ART | PRESENT INVENTION |
|---|---|---|
| tA (ACT~RED) | 2 CLKs | 2 CLKs |
| tB (RED~WRT) | 8 CLKs | 8 CLKs |
| tC (WRT~PRE) | 5 CLKs | (REDWRT~PRE) |
| TOTAL | 15 CLKs | 10 CLKs |

Fig. 4

|  | RELATED ART | PRESENT INVENTION |
|---|---|---|
| FOR ADDRESS | M TERMINALS | M TERMINALS |
| FOR DATA OUTPUT | N TERMINALS |  |
| FOR DATA INPUT |  | N TERMINALS |
| TOTAL | M+N TERMINALS | M+N TERMINALS |

Fig. 5

SEMICONDUCTOR STORAGE DEVICE AND ITS CONTROL METHOD

INCORPORATION BY REFERENCE

This application is based upon and claims the benefit of priority from Japanese patent application No. 2009-196174, filed on Aug. 27, 2009, the disclosure of which is incorporated herein in its entirety by reference.

BACKGROUND

1. Field of the Invention

The present invention relates to a semiconductor storage device and its control method.

2. Description of Related Art

In recent years, as mobile digital terminals have become more sophisticated, it has been desired to process a huge amount of digital data at very high speed. To achieve such high-speed processing, it is necessary to use a memory capable of temporarily storing data at a high speed as well as a high-performance MPU (Micro Processing Unit) processing device.

However, the improvement in operation speed of memories (for example, DRAMs, which are commonly used as larger-capacity RAMs (Random Access Memories)) has been significantly slower in comparison to the improvement in operation speed of MPUs, and the improvement in operation speed of memories has become a critical problem to be solved in the speeding-up of digital data processing.

Therefore, high-speed data transfer techniques like the one called "DDR (Double Data Rate)" have been used in the past. However, the novel feature of such transfer techniques is merely that only the data transfer in which data is synchronized with a clock and transmitted through a dedicated data transfer pin is made faster, and the fundamental configuration as a memory has not changed significantly from the conventional ones.

In the conventional memories, data input and output are both carried out only through data input and output terminals.

Further, Japanese Unexamined Patent Application Publication No. S60-236185 discloses a semiconductor memory capable of changing the number of output bits. This memory includes output bit change means that enables a certain terminal to have variable functions in a programmable manner so that the terminal is used as an address input terminal or an output terminal, or an input/output terminal.

Note that, in general, data stored in a memory is frequently rewritten. That is, once data corresponding to a certain address is read and processed by an MPU, the MPU often writes new data at the same address to execute a subsequent process.

However, in the memory disclosed in Japanese Unexamined Patent Application Publication No. S60-236185, it seems possible to increase the data transfer amount by expanding the output bit wide. However, for the operation in which reading and writing are performed in succession, it is necessary to perform the successive writing after the successive reading is completed. That is, in the memory disclosed in Japanese Unexamined Patent Application Publication No. S60-236185, when reading and writing of data corresponding to the same address are performed, the operation speed is not increased in comparison to the conventional products.

In contrast to this, Japanese Unexamined Patent Application Publication No. H7-312080 discloses a memory that is equipped with separate data input terminals and data output terminals so that data writing and data reading can be performed in parallel.

SUMMARY

However, since the memory disclosed in Japanese Unexamined Patent Application Publication No. H7-312080 is equipped with separate data input terminals and data output terminals, the number of terminals increases, thus causing a problem that the miniaturization of the semiconductor storage device is not feasible.

A first exemplary aspect of the present invention is a semiconductor storage device in which successive reading and successive writing of data having a predetermined length from and to a memory cell specified by a certain address are performed, the semiconductor storage device including: a plurality of memory cells; address input terminals through which the address is input; data output terminals through which read data having the predetermined length is output; and data input terminals through which write data having the predetermine length is input, wherein part of the address input terminals are also used as the data output terminals.

By using some of the address input terminals as the data output terminal in this manner, it is possible to start, before the operation of one of successive reading and successive writing is completed, the operation of the other of the successive reading and successive writing without increasing the numbers of terminals.

Another exemplary aspect of the present invention is a semiconductor storage device including a logic circuit having a function of performing successive reading and successive writing of data retained in a memory cell according to an input command, wherein the logic circuit selects a memory cell on which successive reading and successive writing are performed according to a read/write command, and the logic circuit starts, before an operation of one of successive reading and successive writing of data having a predetermined length is completed, an operation of another of the successive reading and successive writing from or to the memory cell on which the reading or writing is completed.

In this manner, before the start of the operation of one of the successive reading and successive writing of data having the predetermined length from or to the memory cell specified by the certain address is completed, the operation of the other of the successive reading and successive writing of data from or to the memory cell on which the reading or writing is completed is started. By doing so, the operation of successive reading and successive writing at the same address can be made faster.

Another exemplary aspect of the present invention is a control method of a semiconductor storage device including: selecting, upon reception of a read/write command, a memory cell on which successive reading and successive writing are performed by outputting a certain address to a storage unit; and successively starting, before an operation of one of successive reading and successive writing of data having a predetermined length from or to a memory cell specified by the certain address is completed, an operation of another of the successive reading and successive writing from or to the memory cell on which the reading is completed.

In this manner, before the start of the operation of one of the successive reading and successive writing of data having the predetermined length from or to the memory cell specified by the certain address is completed, the operation of the other of the successive reading and successive writing of data from or to the memory cell on which the reading or writing is completed is started. By doing so, the operation of successive reading and successive writing at the same address can be made faster.

According to a storage device of the present invention, it is possible to speed up the operation of successive reading and successive writing performed to the same address without increasing the number of the terminals.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 4 shows a comparison in specifications (the number of CLKs necessary for operation) between a memory 13 in accordance with an exemplary embodiment of the present invention and that in related art; and FIG. 5 shows numbers of terminals of a memory 13 in accordance with an exemplary embodiment of the present invention and that in related art.

DETAILED DESCRIPTION OF THE EXEMPLARY EMBODIMENTS

Exemplary Embodiment

Figure 1:
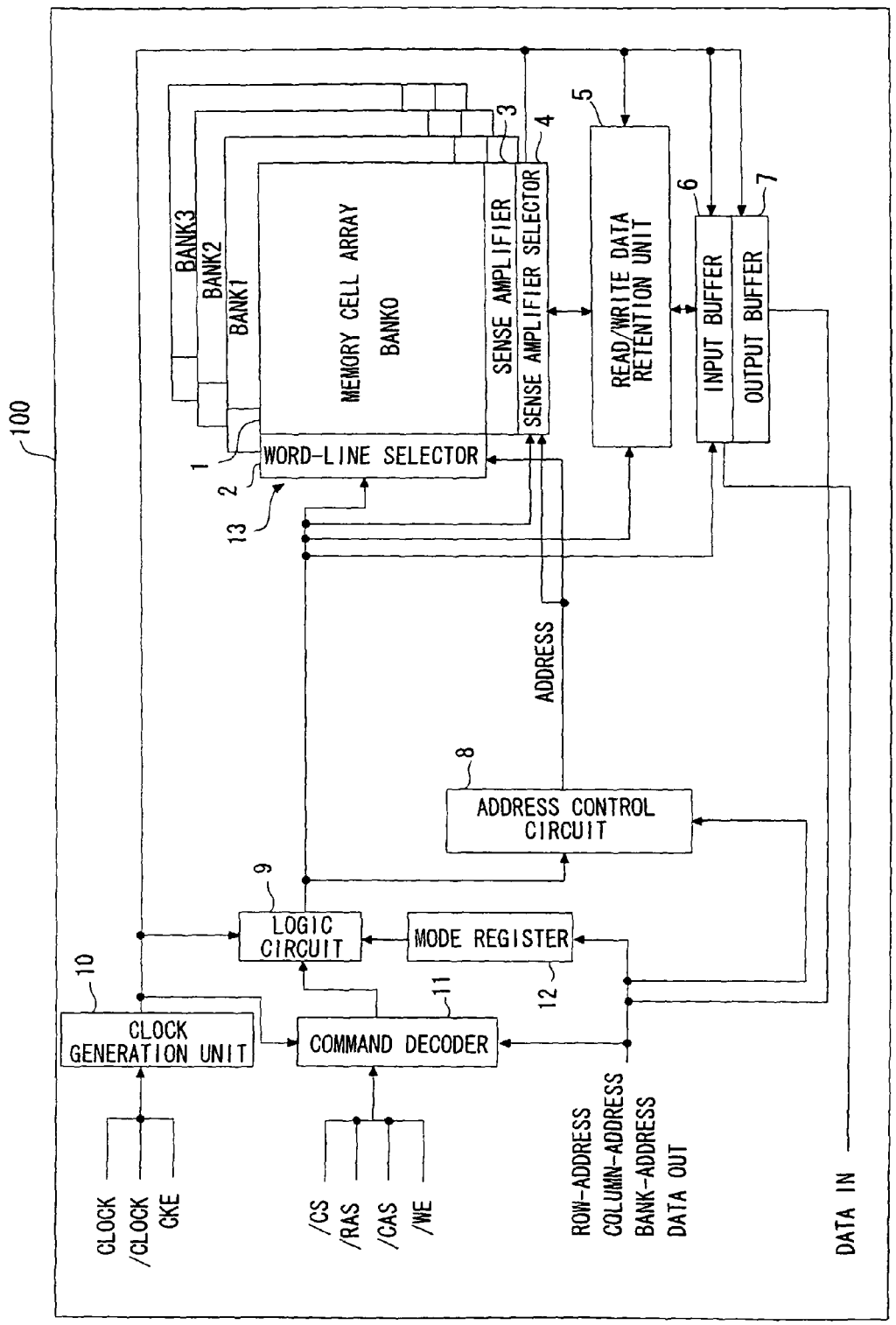
FIG. 1 shows a configuration example of a semiconductor storage device in accordance with an exemplary embodiment of the present invention.

An exemplary embodiment of the present invention is explained hereinafter with reference to the attached drawings. FIG. 1 is a block diagram illustrating a configuration example of a semiconductor storage device 100 in accordance with an exemplary embodiment of the present invention. The semiconductor storage device 100 includes a logic circuit 9 and a memory 13. The logic circuit 9 has a function of performing successive reading and successive writing of data having a predetermined length from and to a memory cell of the memory 13 specified by a row address and a start column address. Note that the following explanation is made on the assumption that the memory 13 is a DRAM (Dynamic Random Access Memory).

The memory 13 includes a memory cell array 1 including a plurality of memory cells that retain data, address input terminals through which a row address and a start column address are input, data output terminals through which read data having a predetermined length read from a memory cell specified by a row address and a start column address is output, and data input terminals through which write data having a predetermined length to be written to a memory cell specified by a row address and a start column address is input.

Some of the address input terminals are also used as data output terminals. In this exemplary embodiment, the number of terminals that function as an address input terminal is larger than that of terminals that function as a data output terminal. In the following explanation, address input terminals that are also used as data output terminals among all the address input terminals are referred to as "address input/data output terminals".

Further, the semiconductor storage device 100 also includes a clock generation unit 10, a command decoder 11, a logic circuit 9, a mode register 12, an address control circuit 8, a word-line selector 2, a sense amplifier 3, a sense amplifier selector 4, a read/write data retention unit 5, an input buffer 6, and an output buffer 7.

The clock generation unit 10 generates a clock signal used within the semiconductor storage device 100 based on a clock signal CLK, an inverted clock signal /CLK, and a clock enable signal CKE. The command decoder 11 decodes a command specified by signals such as a chip select signal CS, an RAS (Row Address Strobe) signal, a CAS (Column Address Strobe) signal, a write enable signal WE.

The logic circuit 9 generates control signals to the address control circuit 8, the word-line selector 2, the sense amplifier selector 4, and the read/write data retention unit 5 according to a command decoded in the command decoder 11 and an operating mode specified by the mode resistor. The mode register 12 specifies an operating mode such as a burst mode and a normal operating mode based on an externally-input address.

The address control circuit 8 includes an address buffer, a refresh counter, and a burst counter. The address buffer temporarily retains an externally-input row address and column address. The refresh counter, which is used for a DRAM, sets the refresh cycle of the DRAM and generates a refresh address of the DRAM. The burst counter generates an address to specify a memory cell in the burst operation for the memory.

The address control circuit 8 outputs an address generated in the address buffer, the refresh counter, and the burst counter as a row address and a column address. The row address specifies the position of a memory cell in the row direction among the memory cells arranged in a lattice pattern in the memory cell array 1. The column address specifies the position of a memory cell in the column direction among the memory cells arranged in a lattice pattern in the memory cell array 1. Further, the address control circuit 8 selects and outputs one of addresses output from the address buffer, the refresh counter, and the burst counter based on a control signal output from the logic circuit 9. When the semiconductor storage device 100 is set to a burst mode where successive reading and successive writing are performed, the address control circuit 8 outputs a row address and a start column address, i.e., a column address at which the reading or writing starts to be performed.

The memory cell array 1 includes a plurality of memory cells arranged in a lattice pattern. The word-line selector 2 selects one of a plurality of word lines based on a row address. In each word line, a plurality of memory cells that are located on the same row among all the memory cells arranged in a lattice pattern are connected. In this way, when the word-line selector 2 selects one of the word lines, the memory cells connected to the selected word line are activated.

Each of sense amplifiers 3 is connected to a pair of bit lines. Each bit-line pair is composed of a pair of two bit lines, and each bit-line pair is handled as one column. In each bit-line pair, a plurality of memory cells that are located on the same column among all the memory cells arranged in a lattice pattern are connected. The sense amplifier selector 4 selects one of a plurality of pairs each composed of a write amplifier and a sense amplifier based on a column address CAY. Note that the semiconductor storage device 100 may include a plurality of sets each composed of a memory cell array 1, a word-line selector 2, and a sense amplifier 3. Each of the plurality of sets is referred to as "bank". In FIG. 1, BANK0 to BANK3 are shown. The operation of BANK0 is explained hereinafter.

The read/write data retention unit 5 includes a plurality of latch circuits. The read/write data retention unit 5 takes in externally-input data in synchronization with a clock signal output from the clock generation unit 10, and outputs the taken data to a sense amplifier selected by the sense amplifier selector 4. The read/write data retention unit 5 takes in data output from the sense amplifier 3 selected by the sense amplifier selector 4 in synchronization with a clock signal output from the clock generation unit 10, and outputs the taken data to the output buffer 7. The input buffer 6 outputs externally-input data to the read/write data retention unit 5. The output buffer 7 externally outputs data output from the read/write data retention unit 5.

Figure 2:
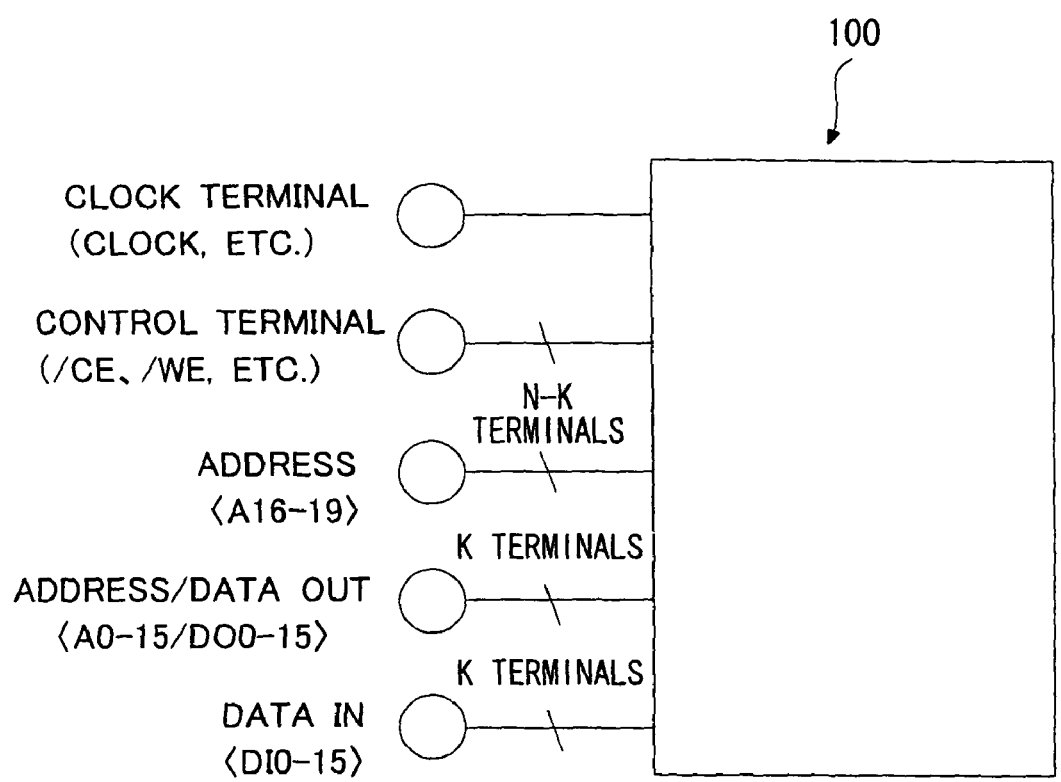
FIG. 2 shows a configuration example of terminals of a semiconductor storage device in accordance with an exemplary embodiment of the present invention.

FIG. 2 shows a configuration example of terminals of the semiconductor storage device 100 in accordance with this exemplary embodiment of the present invention. The semiconductor storage device 100 includes a clock terminal through which a CLOCK and the like are input, control terminals through which control signals such as a chip enable signal and a write enable signal are input, address input terminals through which an address is input, and data input terminals through which data is input. Some of the address input terminals function as address input/data output terminals through which an address is input and data is externally output.

Specifically, assuming that the total number of pins that function as address terminals (ADDRESS+ADDRESS/DATA OUT) is N, and that the number of pins that function as data input terminals and the number of pins that function as data output terminals are both K, the number of pints of the address input/data output terminals is K and the number of pins of the address input terminals that are used only for address input is N-K.

Next, an operation of the semiconductor storage device 100 having a configuration like this is explained hereinafter with reference to FIG. 3. In this operation, data is read at a certain address of the memory 13, and then data is written at the same address. Note that in this operation, all the terminals for address input and terminals for data input provided in the memory 13 are used.

Figure 3:
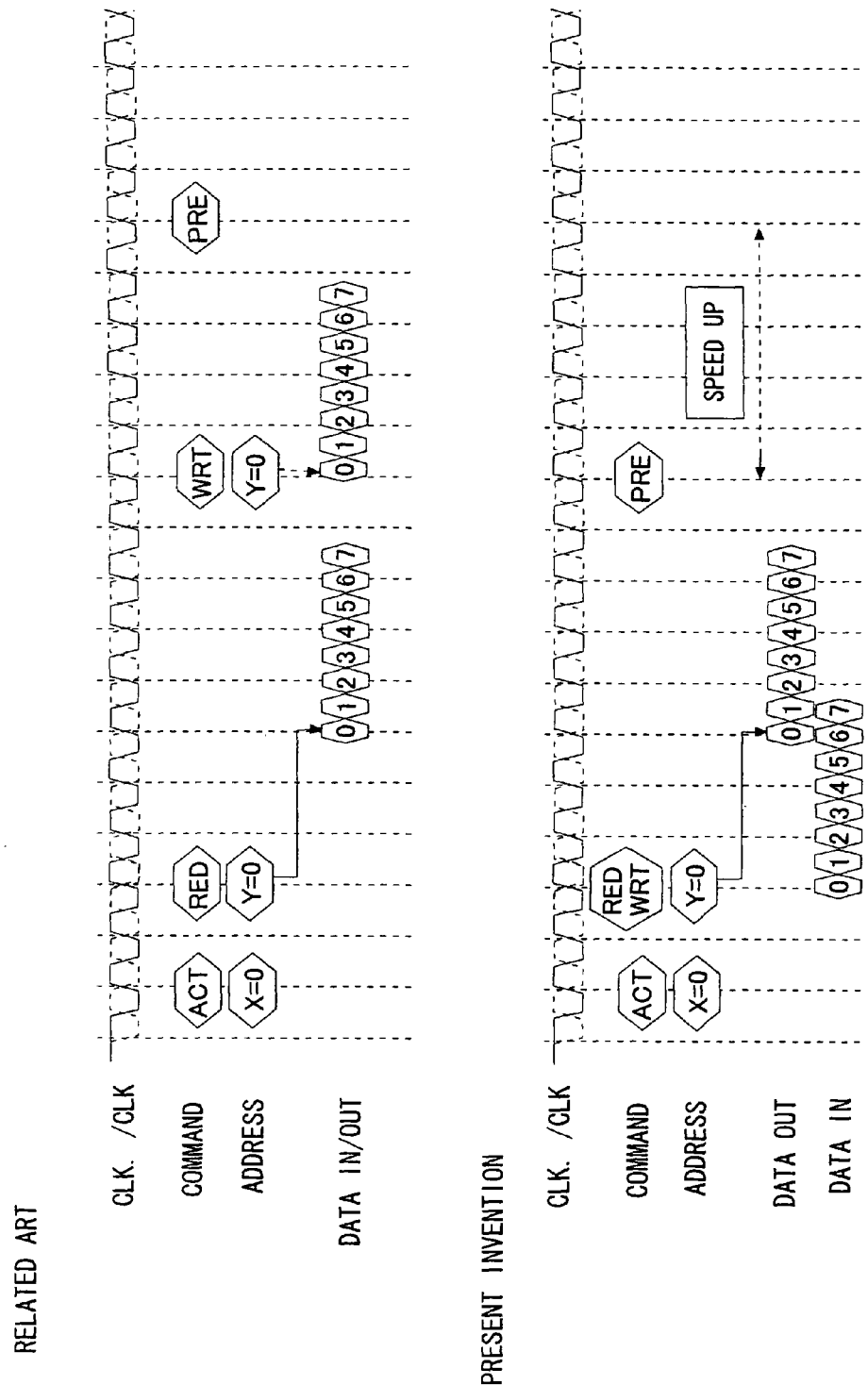
FIG. 3 is a timing chart showing memory operations in a semiconductor storage device in accordance with an exemplary embodiment of the present invention and a semiconductor storage device in related art.

FIG. 3 is a timing chart showing an operation of a memory of a DDR SDRAM in related art and that to which this exemplary embodiment of the present invention is applied, in which successive reading and successive writing are performed at the same address. The upper portion of FIG. 3 shows a process in which successive reading and successive writing are performed in a semiconductor storage device in related art in which data input terminals are also used as data output terminals. Further, the lower portion of FIG. 3 shows a process in which successive reading and successive writing are performed in a semiconductor storage device in accordance with this exemplary embodiment. Note that the following explanation with reference to FIG. 3 is made on the assumption that the burst length is eight.

In the semiconductor storage device in the related art, after a row address (X=0) is input simultaneously with input of an ACT command, a start column address (Y=0) is input simultaneously with input of a READ command to read data (0 to 7) in succession through the data input/output common terminals. Then, after the successive reading of the data (0 to 7) is completed, a start column address (Y=0) is input simultaneously with input of a WRITE command to write data (0 to 7) in succession through the data input/output common terminals. Then, the series of operations is completed with input of a PRE command.

In contrast to this, in this exemplary embodiment of the present invention, a row address (X=0) is input through the address input terminals including the address input/data output terminals simultaneously with input of an ACT command. Then, two processes, i.e., successive reading and successive writing are performed in parallel by the input of one command REDWRT. That is, a start column address (Y=0) is input through the address input terminals including the address input/data output terminals simultaneously with input of the REDWRT command. In this way, data writing to memory cells corresponding to column addresses (Y=0 to 7) is started from a memory cell determined by the row address (X=0) and the start column address (Y=0).

Then, before the successive writing of data having a predetermined length (burst length), which is started from a memory cell specified by the row address (X=0) and the start column address (Y=0), is completed, that is, before the data writing to the memory cell specified as "X=0, Y=7" is completed, successive reading of data is started in succession from the memory cell (X=0, Y=0) to which the reading was already completed. After that, the series of operations is completed with input of a PRE command.

As described above, according to the semiconductor storage device 100 in accordance with this exemplary embodiment of the present invention, by providing the memory 13 with address input terminals including address input/data output terminals and data input terminals separately, data input and data output to and from the memory 13 can be performed in parallel. In other words, by providing the memory 13 with address input terminals including address input/data output terminals and data input terminal separately, successive reading can be started before the successive writing shown in FIG. 3 is finished. Further, since some of the address input terminals are also used as data output terminals, the number of terminals does not increase. In this way, the memory 13 and the semiconductor storage device 100 in accordance with this exemplary embodiment can be miniaturized in comparison to semiconductor storage devices in related art, and the operation of the memory can be made faster.

Further, in the memory in the related art, when data reading and subsequent data writing are performed at the same address, both the READ command and WRITE command need to be input, thus increasing the operating time of the memory. In contrast to this, in the memory 13 and the semiconductor storage device 100 in accordance with this exemplary embodiment, successive writing and successive reading are performed by the input of one command REDWRT. Therefore, the number of commands output from the MPU to the memory 13 can be reduced in comparison to the memory in the related art.

Advantageous effects of the semiconductor storage device 100 in accordance with this exemplary embodiment are further explained hereinafter with reference to FIGS. 4 and 5. FIG. 4 shows a comparison in specifications (the number of CLKs necessary for operation) between the memory 13 in accordance with this exemplary embodiment and that in the related art in which data input terminals are also used as data output terminals.

In FIG. 4, the time to indicates the duration from when a command ACT is input to when a command RED is input. The time tB indicates the duration from when a command RED is input to when a command WRT is input. The time tC indicates the duration from when a command WRT is input to when a command PRE is input. While the time tA (ACT to RED) is the same 2 CLKs in both the related art and the exemplary embodiment, the time tB (RED to WRT) and the time tC (WRT to PRE) can be reduced by a processing time equivalent to 5 CLKs in the exemplary embodiment in comparison to the related art.

That is, by applying this exemplary embodiment, the time tA+tB+tC (ACT to PRE) can be reduced from 15 CLKs of the related art to 10 CLKs in the operation example shown in FIG. 3. In this way, in the memory 13 in accordance with this exemplary embodiment, successive reading and successive writing at the same address can be completed in 66.7% of the processing time required for the memory operation in the related art.

Further, FIG. 5 shows the numbers of terminals of the memory 13 in accordance with this exemplary embodiment and that in related art in which common data terminals are used as both data input terminals and data output terminals. In the related art, M terminals are necessary as terminals for address input and N terminals are necessary as data input/output terminals. Therefore, M+N terminals are necessary in total. In contrast to this, in the memory 13 in accordance with this exemplary embodiment, M terminals are necessary as address input terminals including address input/data output terminals and N terminals are necessary as data input terminals. Therefore, M+N terminals are necessary in total. That is, the number of terminals of the semiconductor storage device in the related art and that of the semiconductor storage device in accordance with this exemplary embodiment are the same. Therefore, since the number of terminals of the semiconductor storage device 100 in accordance with this exemplary embodiment does not increase in comparison to that of the semiconductor storage device in the related art, the semiconductor storage device 100 can be mounted on the same package as the conventional products.

Note that the exemplary embodiments of the present invention are not limited to the example explained above, and various design modifications can be made by those skilled in the art. For example, while the explanation of the above-described exemplary embodiment is made on the assumption that the memory 13 is a DRAM, examples of the memory 13 include a flash memory and an SRAM (Static Random Access Memory). That is, the present invention is applicable to the whole spectrum of memories.

Further, while the operation of the above exemplary embodiment is made on the assumption that reading operation is first performed and then writing operation is performed, the present invention is also applicable to operations in which successive writing is first performed and then successive reading is performed. In such a case, the reading may start to be performed in succession from the memory cell to which the writing was already completed. In this way, similarly to the case where the writing operation is performed after the reading operation, the processing time required to perform the successive writing and successive reading can be reduced.

Note that the present invention is not limited to the above-described exemplary embodiments, and various modifications can be made without departing from the scope and spirit of the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device comprising:
   a plurality of memory cells;
   address input terminals through which an address is input;
   data output terminals through which read data having a predetermined length is output; and
   data input terminals through which write data having the predetermined length is input; and
   a logic circuit performing a successive reading and a successive writing in which a reading operation and a writing operation are performed to a set of the memory cells,
   wherein part of the address input terminals are also used as the data output terminals, and
   the logic circuit starts, during an operating period of one of the successive reading and the successive writing for a first set of the memory cells, an operation of an other one of the successive reading and the successive writing for a second set of memory cells.

2. The semiconductor storage device according to claim 1, further comprising:
   a write data retention unit that retains the write data input through the data input terminals; and
   a read data retention unit that retains the read data to be output through the data output terminals.

3. A control method of a semiconductor storage device, said control method comprising:
   selecting, upon reception of a read/write command, a set of memory cells on which successive reading and successive writing are to be performed by outputting a certain address to a storage unit; and
   starting, during an operating of one of successive reading and successive writing of data having a predetermined length from or to the set of memory cells specified by an address beginning with the certain address, an operation of an other one of the successive reading and the successive writing for a second set of memory cells.

4. The control method of a semiconductor storage device according to claim 3, wherein the semiconductor storage device comprises a semiconductor storage device in which the successive reading and the successive writing of data having a predetermined length from and to the memory cell specified by the certain address are performed, the semiconductor storage device comprising:
   a plurality of memory cells;
   address input terminals through which the address is input;
   data output terminals through which read data having the predetermined length is output; and
   data input terminals through which write data having the predetermined length is input, and part of the address input terminals are also used as the data output terminals.

5. A semiconductor storage device having a burst read mode and a burst write mode, comprising:
   a plurality of, memory cells;
   address input terminals through which a part of an address is input;
   output address common terminals that serve as output terminals for entire data or address input terminals for a remaining address part other than the part of address;
   data input terminals;
   a control terminal;
   a read register having a length equivalent to a burst length of the burst read mode;

a write register having a length equivalent to a burst length of the burst write mode;

a command decoder that decodes an input supplied through the control terminal;

a mode register to which information is input through the output address common terminals; and a logic circuit that receives an output of the mode register and an output of the command decoder, controls the read register and the write register, and performs a successive reading and successive writing in which a reading operation and a writing operation are performed to a set of the memory cells, wherein the logic circuit starts, during an operating period of one of the successive reading and the successive writing for a first set of the memory cells, an operation of an other one of the successive reading and the successive writing for a second set of memory cells.

6. The semiconductor storage device according to claim 1, further comprising a memory cell array wherein a row address and a start column address are input through the address input terminals.

7. The semiconductor storage device according to claim 1, wherein the logic circuit performs the successive reading of the read data and the successive writing of the write data.

8. The semiconductor storage device according to claim 7, wherein each of the read data and the write data is retained in a memory cell of the plurality of memory cells, and the successive reading and the successive writing are each performed according to an input command, and wherein the logic circuit starts, before an operation of one of the successive reading and the successive writing to or from the memory cell is completed, an operation of an other one of the successive reading and the successive writing from or to the memory cell.

9. The semiconductor storage device according to claim 1, further comprising a command decoder that decodes an input signal supplied through a control terminal.

10. The semiconductor storage device according to claim 8, further comprising a mode register to which information is input through the part of the address input terminals that are also used as data output terminals.

11. The semiconductor storage device having a burst read mode and a burst write mode according to claim 5, wherein the output received by the logic circuit from the command decoder is decoded from at least one of a chip select signal, a row address strobe signal, a column address strobe signal, and a write enable signal.

12. The semiconductor storage device having a burst read mode and a burst write mode according to claim 5, wherein the mode register specifies an operating mode based on an externally-input address.

13. The semiconductor storage device according to claim 1, wherein a first successive reading occurs after a first successive writing.

14. The semiconductor storage device according to claim 1, wherein the logic circuit has a function of performing successive reading and successive writing of data retained in a memory cell of the plurality of memory cells according to an input command, and starts, before an operation of the successive writing of the write data having the predetermined length is completed, an operation of the successive reading from the memory cell on which the successive writing is being completed.

15. The semiconductor storage device according to claim 5, wherein the logic circuit has a function of performing successive reading and successive writing of data retained in a memory cell of the plurality of memory cells according to the outputs of the mode register and the command decoder, and starts, before an operation of one of the successive reading and the successive writing of data having the predetermined length is completed, an operation of an other one of the successive reading and the successive writing from or to the memory cell on which the one of the successive reading or the successive writing is being completed.

16. The semiconductor storage device according to claim 5, wherein the data input terminals are different than the output address common terminals.

17. The semiconductor storage device according to claim 1, wherein the first set includes a plurality of memory cells specified by first successive addresses beginning with a first address, the second set includes a plurality of memory cells specified by second successive addresses beginning with a second address, and the second address comprises a same address as the first address.

18. The semiconductor storage device according to claim 1, wherein a period of outputting the read data through the data output terminals overlaps with a period of inputting the write data through the data input terminals, when the successive reading and the successive writing is performed.

* * * * *